United States Patent [19]

Nogas et al.

[11] Patent Number: 5,677,830
[45] Date of Patent: Oct. 14, 1997

[54] MODULAR, STACKING, EXPANDABLE ELECTRONIC ENCLOSURE SYSTEM

[75] Inventors: David A. Nogas, Ottawa; Willi Lotz, Carp, both of Canada; Michael G. Emler, Rochester, N.Y.

[73] Assignee: Mitel Corporation, Kanata, Canada

[21] Appl. No.: 397,354

[22] Filed: Mar. 2, 1995

[51] Int. Cl.⁶ .................................................. H01R 23/68
[52] U.S. Cl. .................... 361/790; 361/732; 361/735; 361/804; 361/733
[58] Field of Search ............................ 361/729, 730, 361/731, 732, 733, 735–736, 740, 741, 790, 797, 801–804, 788, 728, 792, 748, 686, 695; 439/70–72, 74, 76, 928, 61; 220/4, 26, 4.02; 206/512, 511, 509, 557, 706; 257/686, 797

[56] References Cited

U.S. PATENT DOCUMENTS

| 4,401,351 | 8/1983 | Record | 439/61 |
|---|---|---|---|
| 4,466,049 | 8/1984 | Chaney et al. | 361/691 |
| 4,501,460 | 2/1985 | Sisler | 361/730 |
| 4,597,291 | 7/1986 | Motomiya | 73/431 |
| 4,630,175 | 12/1986 | Lerude et al. | 361/816 |
| 4,680,674 | 7/1987 | Moore | 361/686 |
| 4,858,070 | 8/1989 | Buron et al. | 361/695 |
| 4,953,060 | 8/1990 | Lauffer et al. | 361/710 |
| 5,226,823 | 7/1993 | Johnson | 439/66 |
| 5,346,402 | 9/1994 | Yasuho et al. | 439/71 |
| 5,410,451 | 4/1995 | Hawthorne et al. | 361/760 |

Primary Examiner—Leo P. Picard
Assistant Examiner—Anthony Dinkins
Attorney, Agent, or Firm—Pascal & Associates

[57] ABSTRACT

An electronic circuit board enclosure comprised of a planar member having dimensions at least equal to dimensions of the circuit board, first pillars fixed to at least one side of the planar member and extending orthogonally to the planar member above the planar member, apparatus for aligning and fixing bottoms of second pillars of another circuit board enclosure to tops of the first pillars, apparatus for fastening a first circuit board to and above the planar member, and locating apparatus for precisely locating the fastening position of the circuit board to the planar member relative to the first pillars, whereby the position of the first circuit board can be located precisely relative to another circuit board fastened to another circuit board enclosure.

26 Claims, 5 Drawing Sheets

MODULAR, STACKING, EXPANDABLE ELECTRONIC ENCLOSURE SYSTEM

FIELD OF THE INVENTION

This invention relates to an expandable housing for printed circuit boards.

BACKGROUND TO THE INVENTION

It is sometimes necessary to allow expansion of a circuit physically retained on a printed circuit board. Expansion allows a user to specify what optional extensions of the circuit are desired. This form of expansion is often used in the structure of personal computers, for example, wherein a motherboard carries a basis circuit, and connectors connected to an expansion bus are used to connect to edge conductors of auxiliary circuits. The result is a structure having a first circuit board in one plane, and plural spaced circuit boards parallel to each other orthogonal to the first circuit board. In order to house this structure, a cabinet must be used which has dimensions of height at least as high as the plural circuit boards and width and depth dimensions dictated by the motherboard.

While the cabinet requirements are clearly large, there is another problem that dictates the size of the cabinet that is required. The cabinet must be made as large as must be required to accommodate as many printed circuit boards as it is possible to connect to the motherboard, and thus is fixed. If the motherboard is end mounted relative to the plural circuit boards, the width of the cabinet must be at least as wide as the length of the motherboard. If the motherboard is side mounted relative to the plural circuit boards, the width of the cabinet must be at least as wide as the length of the motherboard and at least as long as the longest of the motherboard and plural circuit boards. In all cases it is fixed to the above dimensions, even if there is only a single circuit board plugged into the motherboard. Clearly the cabinet in many cases has large empty wasted space.

In another case, the circuit board carries plane mounted connectors which are to mate with plane mounted connectors of another circuit board. Once mated, the circuit boards are closely mounted and parallel to each other. However this structure, while requiring a cabinet which is smaller in overall volume than the earlier example, still requires a cabinet which has a volume sufficient to contain the maximum number of circuit boards expected to be used.

In addition, the latter case presents other problems. Firstly, closely mounted circuit boards are difficult to cool, due to the very narrow space between them necessitated by the typically shallow connectors used to conserve space. Secondly, if the circuit boards are spaced more distantly from each other, misalignment of the connectors can occur due inaccuracies caused by tolerances. In such cases it becomes increasingly difficult to align the connector pins and connect the circuit boards, particularly if the connectors are a large distance from each other, i.e. on opposite sides of the circuit boards.

Thirdly, the connectors of closely spaced circuit boards become difficult to disengage, and tools must be used to pry them apart. This can cause stresses on the boards, since one side or the other of the circuit board is typically subjected to a prying force, which can cause flexing and breaking of conductive tracks carried by the circuit board substrate.

SUMMARY OF THE INVENTION

The present invention is a housing for a circuit board which facilitates circuit boards to be connected into each other, yet grows with the number of circuit boards used. There is thus substantially no wasted space, as in the prior art housings as noted above.

Further, the housings provide both support for, and means for applying disengagement pressure evenly to the edges of the circuit boards, thus minimizing flexing and avoiding resulting cracking of conductive tracks carried by the circuit boards.

The housings provide both means for aligning the circuit boards (and thus their connectors), facilitating easy connection of one circuit board to another.

A removable side gate allows side connector access to any of the circuit boards, giving flexibility of connection to the contained circuit structure. The structure is thus an excellent means for circuit boards to have a series of connectors, one on a circuit board, to connect to each other, and thus to provide an extending backplane, whereby additional circuit boards can plug into the structure, both extending the backplane and extending the housing at the same time.

A novel sidewall to each housing works in conjunction with a corresponding sidewall of an adjacent housing to provide cooling vents, while protecting against ingress of damaging objects into the vicinity of the circuit board.

In accordance with an embodiment of the invention, an electronic circuit board enclosure is comprised of a planar member having dimensions at least equal to dimensions of the circuit board, first pillars fixed to at least one side of the planar member and extending orthogonally to the planar member above the planar member, apparatus for aligning and fixing bottoms of second pillars of another circuit board enclosure to tops of the first pillars, apparatus for fastening a first circuit board to and above the planar member, and locating apparatus for precisely locating the fastening position of the circuit board to the planar member relative to the first pillars, whereby the position of the first circuit board can be located precisely relative to another circuit board fastened to said another circuit board enclosure.

In accordance with another embodiment, an electronic circuit board enclosure assembly is comprised of plural frame structures including apparatus for retaining the frame structure together in a parallel abutting relationship, a coplanar wall of each of the frame structure having a generally U-shaped crossection, the plane of each inner leg of each U-shape being approximately orthogonal to the plane of a corresponding frame structure and having a height sufficient that an upper edge thereof abuts a lower edge of an adjacent inner leg of an adjacent frame structure, the outer leg of each U-shape being angled outwardly from a top of a corresponding inner leg, whereby a bottom edge of an outer leg of a frame structure is spaced from a top edge of an outer leg of an adjacent frame structure, and the inner leg of the frame structure being perforated so as to allow air to pass therethrough and into ambient air via spacing between the bottom edge of the outer leg and a top edge of an outer leg of an adjacent frame structure.

BRIEF INTRODUCTION TO THE DRAWINGS

A better understanding of the invention will be obtained by reading the description of the invention below, with reference to the following drawings, in which:

FIG. 1 is a section of a pair of housings in accordance with an embodiment of the invention, FIGS. 1A and 1B are sectional views of part of a housing showing alternate circuit board locating structures, FIG. 2 is an upper isometric view of a housing with a circuit board not in place, in accordance with an embodiment of the invention, FIG. 2A is a crossection of several frame walls, when several sections of housing are fixed together, FIG. 3 is a lower isometric view of a housing in accordance with an embodiment of the invention, FIG. 3A is an enlarged detail parts of a pair of pillars, illustrating a key structure, FIG. 3B is an isometric view of an enlarged detail of a pillar, FIG. 4 is an exploded isometric view of several housing in accordance with an embodiment of the invention, and FIG. 5 is an isometric view of the entire structure as assembled.

DETAILED DESCRIPTION OF THE INVENTION

Figure 1:
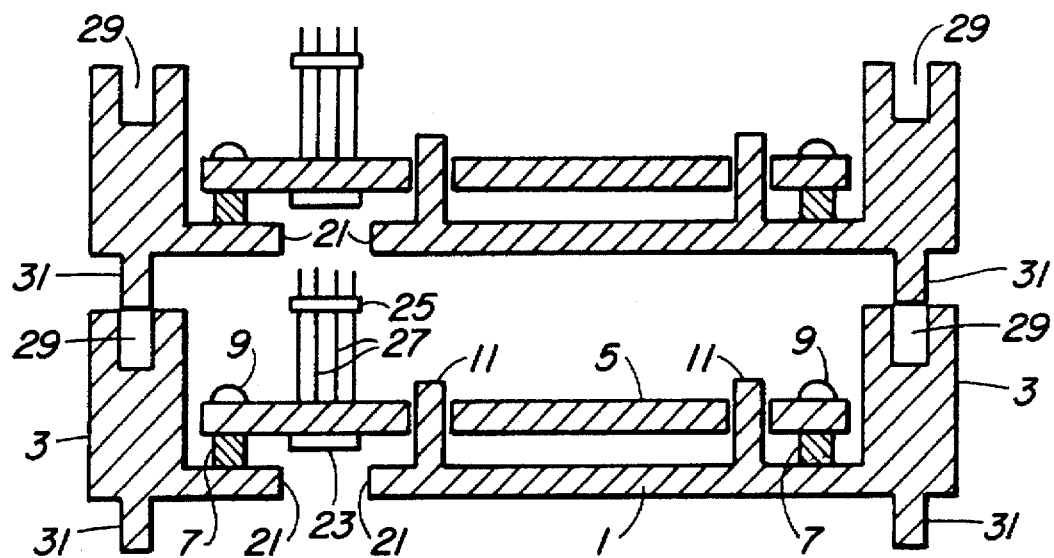

With reference to FIGS. 1, 2, 3 and 4, a planar member 1 is fixed to pillars 3. The planar member contains fastening members for a printed circuit board 5, which fastening members can be standoffs 7 into which screws 9 passing through holes in the circuit board 5 pass. The standoffs are plastic molded together with the planar member 1 and the pillars 3.

Typically the screw holes in the circuit board are oversized slightly to allow the threads of the screws to pass through without biting into the circuit board, which could damage it. Due to the holes being oversize, the sequence of screw tightening and the thread rotation position when the screws are tightened, it is possible for the precise position of one circuit board to be different relative to the pillars than another.

In order to position the circuit board precisely, at least a pair of locator pins 11 is used (only two are needed), which pass through corresponding holes contained in the circuit board. The locator pins 11 are molded together with the planar member.

Since the locator pins can be molded at precise locations relative to the pillars 3, and the holes in the circuit board can be located precisely as a datum points, the position of the circuit board relative to the pillars 3 can be controlled with high precision.

It should be noted that other means for locating the circuit board can be used, which use similar principles. For example, as shown in FIG. 1A, instead of a hole in the circuit board, an alignment bracket 13 fixed to the circuit board can be used. The locator pin 11 can pass into and be contained by a hole 15 in the alignment bracket 13.

Figure 1A:
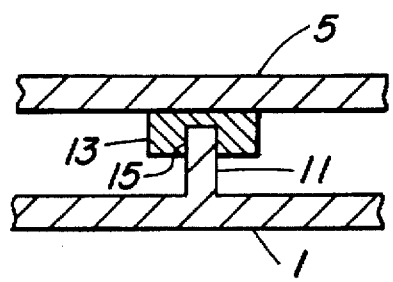
Figure 1B:
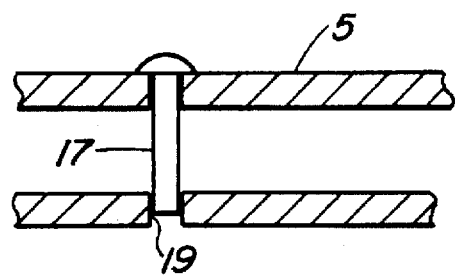
Figure 3B:
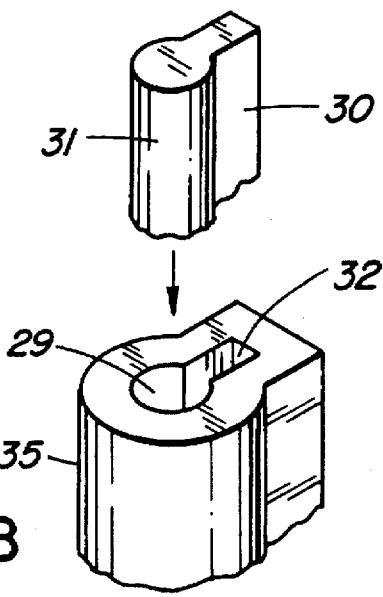

Alternatively, as shown in FIG. 1B, instead of the locator pin being molded with the planar member, a locator pin 17 retained by the circuit board 5 can extend into a precisely positioned hole 19 in the planar member.

The planar member contains a slot 21, and the circuit board retains a connector having a socket 23 and a plug 25 at a lateral position corresponding to the slot 21. As may be seen, a typical plug has long standoff conductors 27, which allows the connectors of spaced circuit boards to connect to each other. Of course the plug and socket can be interchanged. However it may be seen that if adjacent circuit boards are not aligned properly, there could be sufficient misalignment of the pins of the connectors, and it would be difficult to connect them. The present invention provides good precision of alignment.

The pillars preferably are comprised of holes 29 within one end thereof, and pins 31 extending from another end thereof. The pins and holes are dimensioned so that the holes can contain the pins with a snug fit.

Figure 2:
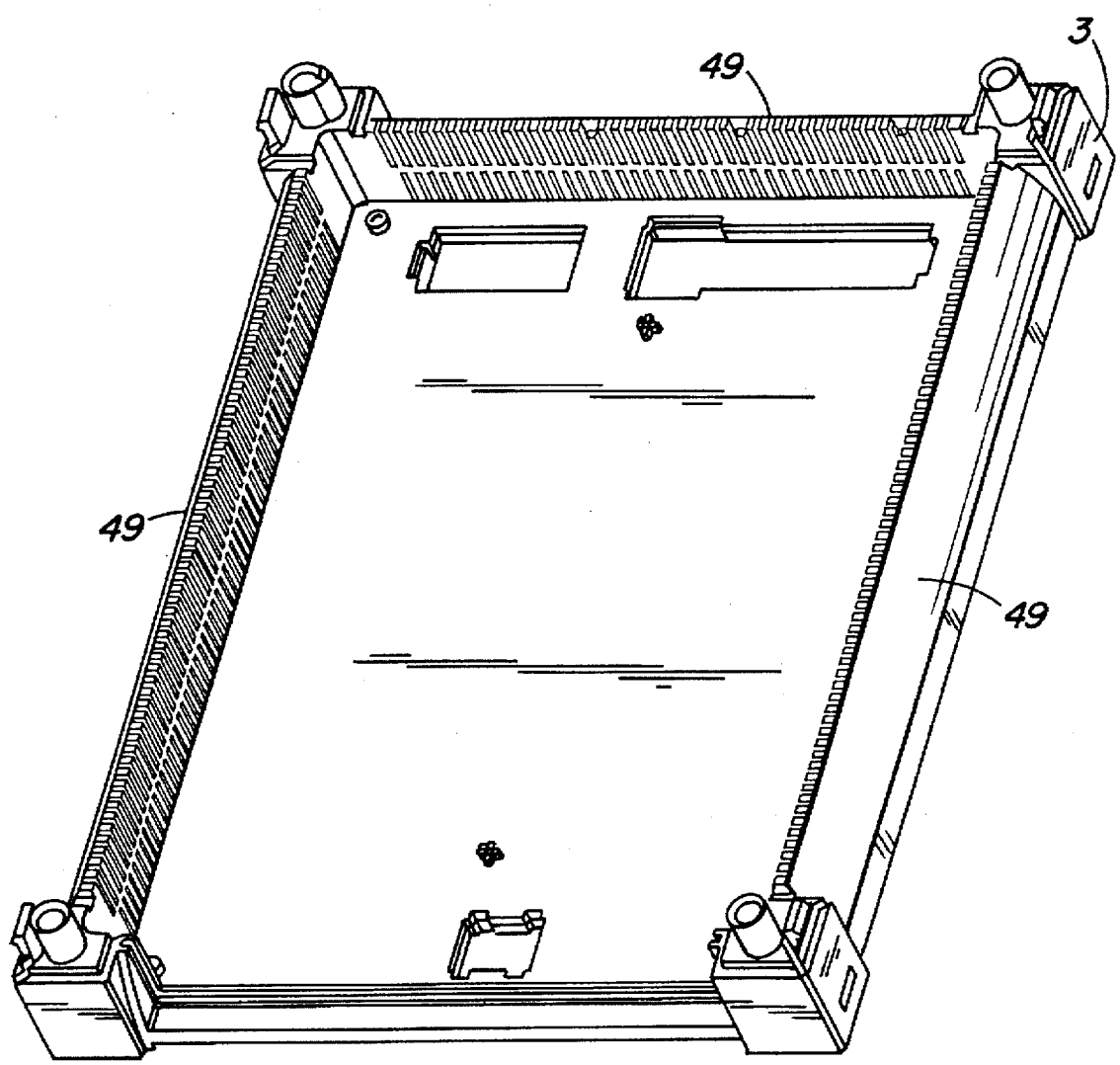
Figure 3:
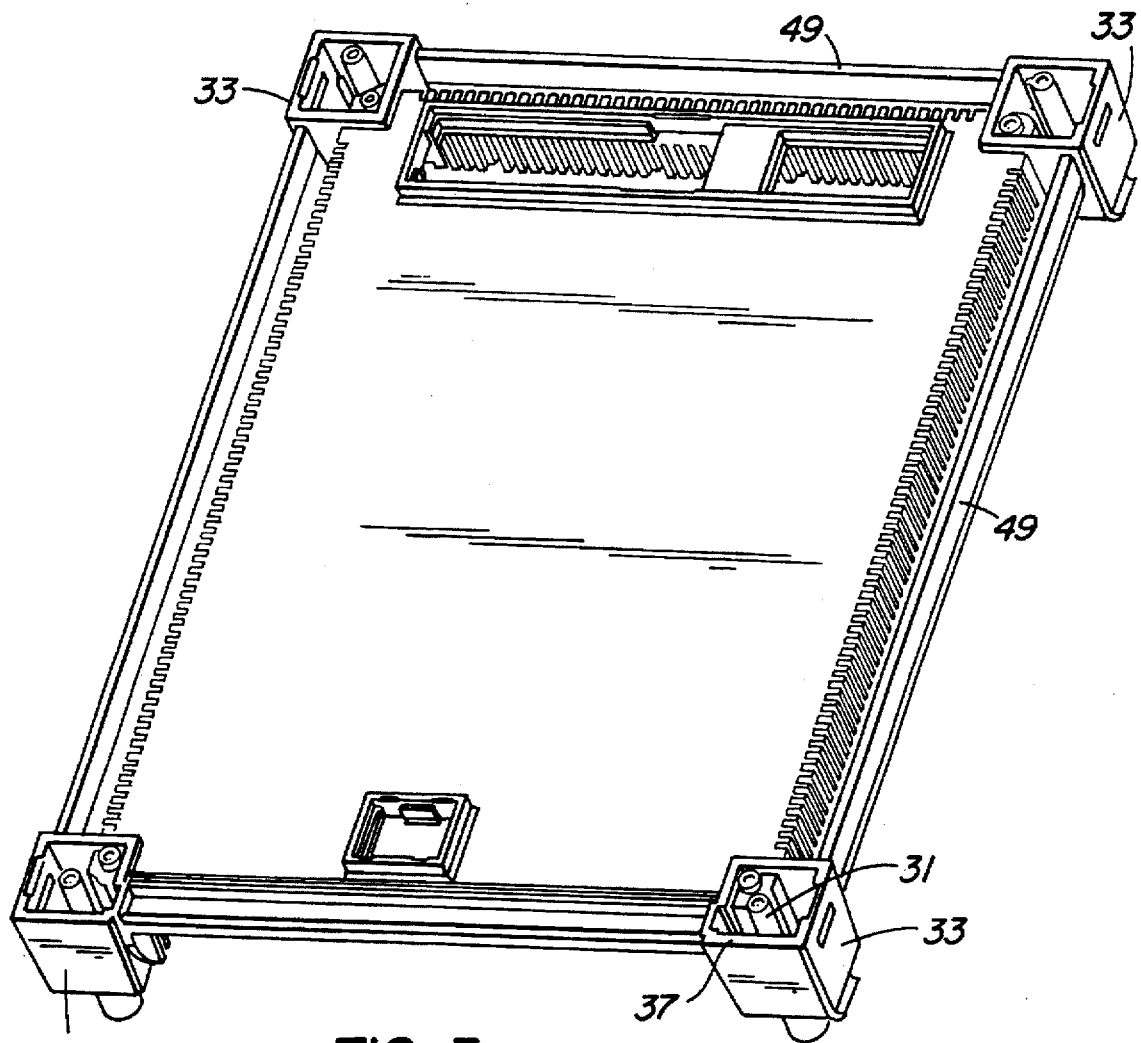
Figure 3A:
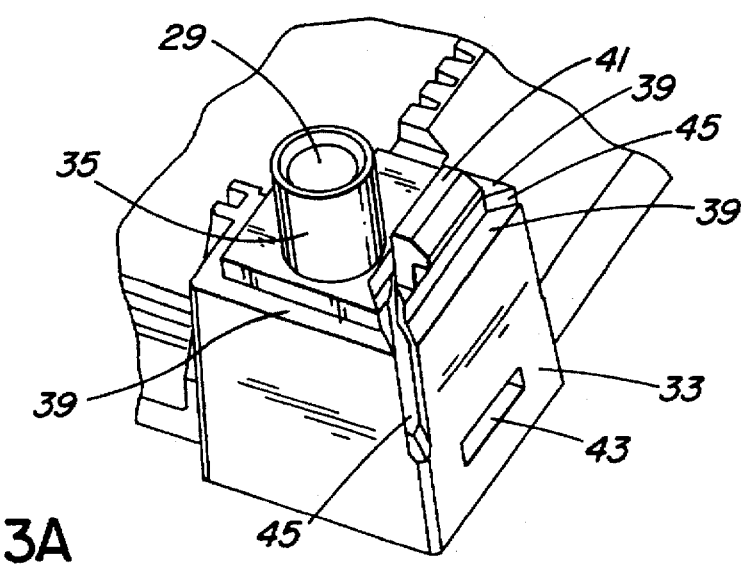

A preferred form of the holes and pins can be seen from an enlarged detail of a pillar shown in FIG. 3A, in conjunction with FIGS. 2 and 3. Since FIG. 3 is an underside of the structure, the pillars shown therein are seen from the bottom view, while the detail of the pillar in FIG. 3A is seen from the top side. FIG. 2 is a top view of the structure (with the circuit board removed for clarity), showing the pillar from the same side as FIG. 3A.

In this embodiment, the pin 31 is contained within a shell 33, while the hole 29 is contained within a cylindrical protrusion 35. The bottom 37 of the shell 33 abuts a shoulder 39 of the pillar when the pillar holes 29 contain the pillar pins 31.

The pin 31 can be formed with a key 30, which fits into slot 32. Use of this structure in one corner can ensure that the housing sections will not be inserted incorrectly. Use of the structure in two opposite corners or in three or four corners can ensure that a user could not insert three corners of the housing structure and then try to force the fourth corner, breaking the key.

It is also preferred that pillars should include latching structures, for latching one housing to the next. As shown in FIG. 3A, the latching structure is preferably comprised of a hook 41, which engages with a slot 43 that passes through a wall of a shell 33. The hook should be made resilient. This can be effected by molding slots into the edges of the wall of the shell 33 from the hook end. This provides a long hook arm, which can flex due to the flexibility of its plastic material.

Figure 4:
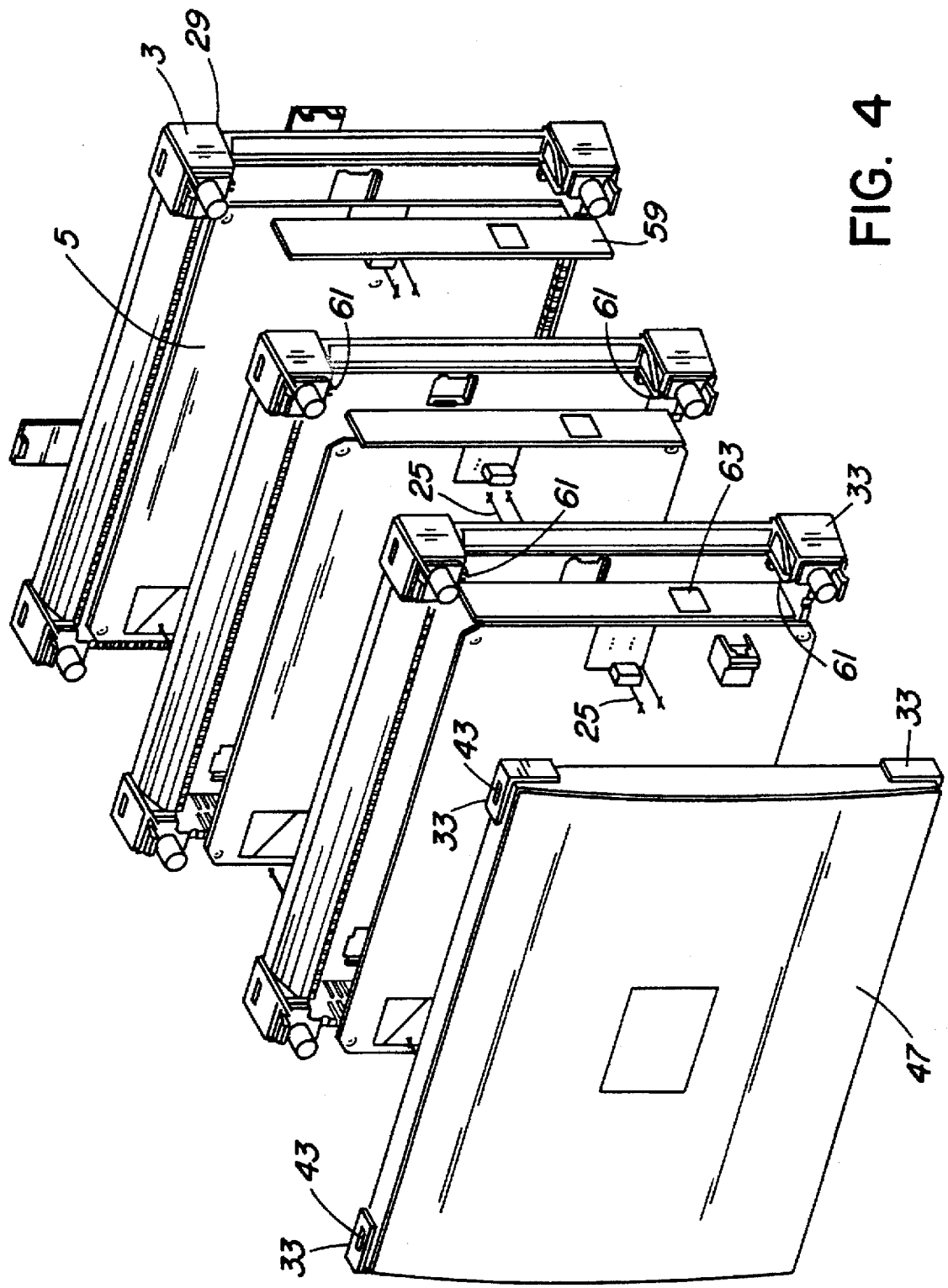

Assembly of the structure so far described may be seen in FIG. 1 and in the exploded view of FIG. 4. Alignment holes in the circuit boards for each housing section are aligned with locator pins 11, and the circuit boards are placed against standoffs 7. The circuit boards are fastened to standoffs 7 by screws 9. At this point the circuit boards are precisely positioned relative to the pillars 3.

The pillars of each section are then mated, with the pins 31 of the pillars of one section passing into the holes 29 of the adjacent pillars of the next section. As the pillars are pushed together, the hooks 41 extend into the interiors of adjacent shells, and resiliently bend, latching into slots 43. The pillars are thereby latched together.

As the pillars are pushed together, the connectors of adjacent circuit boards also mate. Due to the precision of location of the circuit boards, there is substantially no misalignment, and the connectors can mate even if widely laterally spaced on the circuit boards.

It is also preferred that covers 47 should be used to enclose the entire structure. The top cover should have the shell portions 33 of the pillars already described at positions corresponding to the pillars 3 of the housing section to which it is to mate. The shell portions should contain slots 43, into which the hook 41 can latch in order to retain it securely in place. A bottom cover (not shown), should similarly have the post portions of pillars 3, in order to mate with the pillars of the housing section on the other side of the structure, and thus be retained in place.

Figure 5:
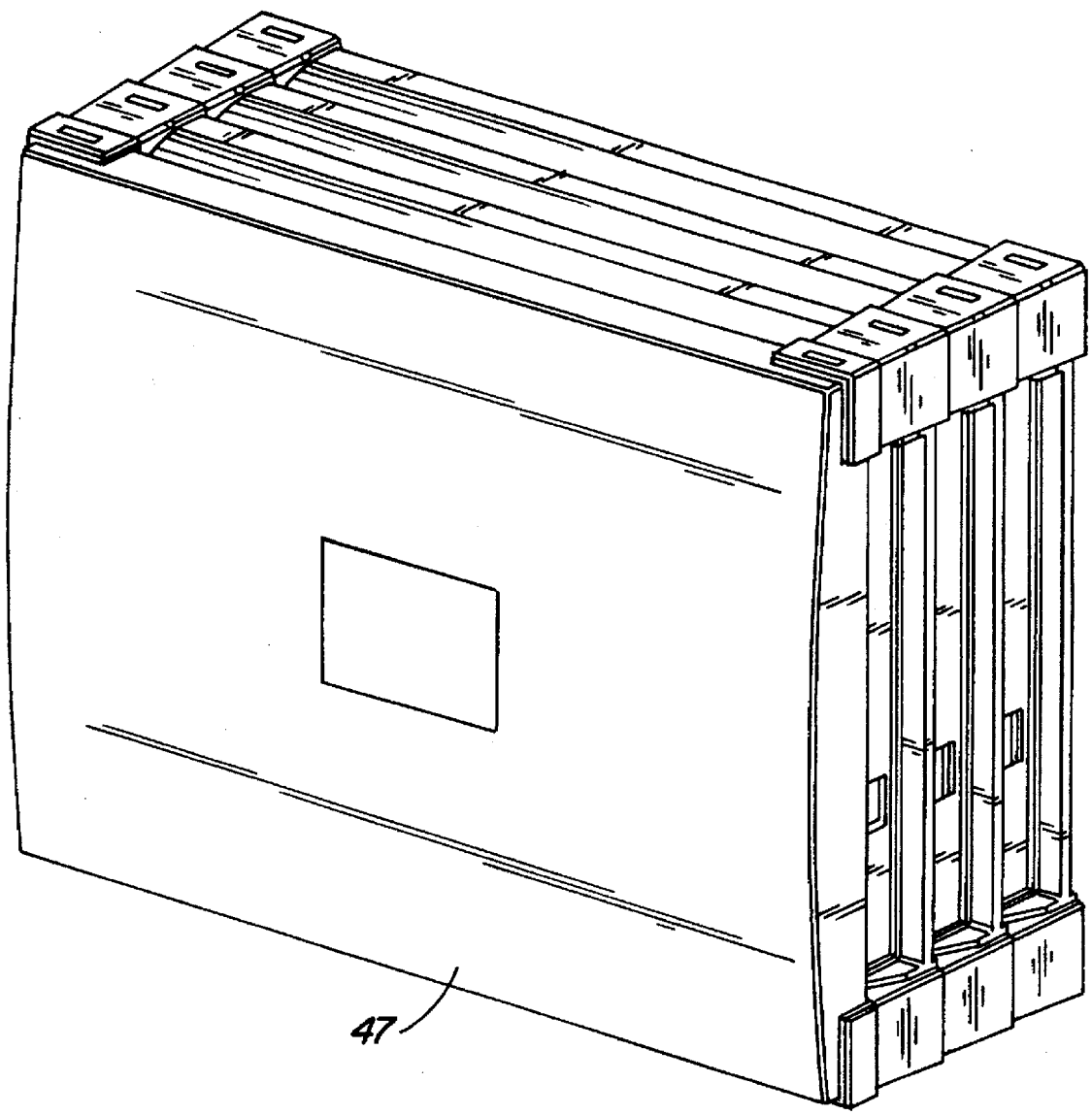

FIG. 5 illustrates an assembled multiple section housing structure. It may be seen that the pillars of each section are mated with, and are latched to the pillars of a succeeding section, and the end face of the structure is protected by cover 47. The circuit boards are connected together. If the circuit board connectors form a backplane for the circuitry, the structure forms both an extending backplane (extended only as far as is needed by the circuit boards), and at the same time, an extending cabinet. Both the cabinet and the backplane are of size restricted to the actual circuit boards used, which results in a highly efficient structure.

Figure 2A:
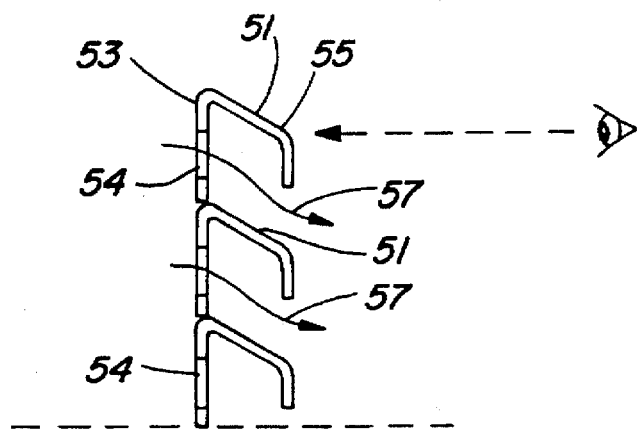

In accordance with another embodiment, a frame 49 is provided around at least three sides of the planar member as shown in FIGS. 2, 2A and 3. The frame shown in these figures pass around only three sides, for the reason to be described below. The frame is molded with the planar member 1 and the sides of the opposite pillars 3.

The frame is preferably formed of a U-shaped member 51, as may be seen in FIG. 2A. The U-shaped member is comprised of an inner leg 53 connected to an outer leg 55. The inner leg 53 contains slots 54 or some other form of perforations, while the outer leg 55 has no perforations. The inner leg has a width which corresponds to the height of the pillars 3, so that when plural housing sections are latched together the top edge of one inner leg abuts the bottom edge of the inner leg of the next section. The outer leg is angled away from its edge where it connects to the inner leg.

The result may be seen in FIG. 2A and FIG. 5. Cooling air can pass via slots 54 into the air channel contained between the legs, as shown by arrow 57. Due to the angle of the outer leg relative to the bottom of the outer leg of the housing section immediately above, the air can pass into the ambient (or can pass from the ambient via slots 54) into the region of the circuit boards, thereby cooling them. However, due to the outer leg having no holes, there is a sight barrier inhibiting a person from looking into the interior of the housing structure. Both this inhibition, as well as the angle and the narrowness of the slot resulting between outer legs 55 of adjacent housing sections, inhibits the likelihood of a person attempting to poke a damaging object into the interior of the housing. The slots 54 form a final barrier against such objects.

While a structure with three walls has been described, a structure with four walls could be used. The fourth wall could usefully contain a hole into which a plug could be inserted to mate with a socket retained at a corresponding position on a circuit board.

Alternatively, as shown in FIG. 4, a removable gate 59 can be used. This gate can be held in slots 61 molded in opposite faces of the pillars 3 adjacent the fourth side.

The gate, which can be a stiff rectangular piece of plastic or metal, can be slid with its short edges into the slots 61. When the structure is assembled as shown in FIG. 5, the gates block access to the circuit boards.

The utility of the gate is that it can be changed to accommodate the requirements of any circuit board which is used with a particular housing section. For example, if no circuit board side mounted connectors are to be used with one section, the gate can have no holes. If a side mounted connector is to be used, a gate with one or plural holes such as hole 63 can be inserted into slots 61. In this manner, the housing sections can be all the same and universally used for all circuit boards, and no special molded structures to suit various circuit board configurations need be fabricated.

In addition, the top and bottom cover in conjunction with the walls both close up the entire structure for protection, but also give the expandable structure a pleasing and finished appearance. The bottom cover can contain one or more keyholes to facilitate mounting the structure on a wall.

While pillars have been described in accordance with a preferred embodiment as being located at corners or a rectangular shaped planar member, it will be recognized by a person skilled in the art understanding this invention that other locations than those described can be used, to suit the particular design.

A person understanding this invention may now conceive of alternative structures and embodiments or variations of the above. All of those which fall within the scope of the claims appended hereto are considered to be part of the present invention.

We claim:

1. An electronic circuit board enclosure comprising a planar member having dimensions at least equal to dimensions of the circuit board, first pillars fixed to at least one side of the planar member and extending orthogonally to the planar member above the planar member, means for aligning and fixing bottoms of second pillars of another circuit board enclosure to tops of said first pillars, means for fastening a first circuit board to and above the planar member, and locating means for precisely locating the fastening position of the circuit board to the planar member relative to said first pillars, whereby the position of the first circuit board can be located precisely relative to another circuit board fastened to said another circuit board enclosure, the locating means being comprised of at least a pair of spaced pins extending orthogonally to the planar member in the same direction as the pillars, which pins have length sufficient to extend through a hole in the first circuit board.

2. An electronic circuit board enclosure comprising a planar member having dimensions at least equal to dimensions of the circuit board, first pillars fixed to at least one side of the planar member and extending orthogonally to the planar member above the planar member, means for aligning and fixing bottoms of second pillars of another circuit board enclosure to tops of said first pillars, means for fastening a first circuit board to and above the planar member, and locating means for precisely locating the fastening position of the circuit board to the planar member relative to said first pillars, whereby the position of the first circuit board can be located precisely relative to another circuit board fastened to said another circuit board enclosure, the locating means being comprised of at least a pair of spaced pins extending orthogonally to the planar member in the same direction as the pillars, which pins have length sufficient to extend into corresponding holes in at least one alignment bracket fixed to the first circuit board and facing the pins.

3. An electronic circuit board enclosure comprising a planar member having dimensions at least equal to dimensions of the circuit board, first pillars fixed to at least one side of the planar member and extending orthogonally to the planar member above the planar member, means for aligning and fixing bottoms of second pillars of another circuit board enclosure to tops of said first pillars, means for fastening a first circuit board to and above the planar member, and locating means for precisely locating the fastening position of the circuit board to the planar member relative to said first pillars, whereby the position of the first circuit board can be located precisely relative to another circuit board fastened to said another circuit board enclosure, bottoms of pillars of said another circuit board enclosure fixed to tops of said first pillars, circuit boards fastened to planar members of each circuit board enclosure and precisely aligned thereto by respective locating means, the planar members containing aligned slots, a plug retained by one of the circuit boards being located opposite to and within the boundaries of the slots, a socket retained by another of the circuit boards being located opposite to and within the boundaries of the slots, at least one of the plug and socket extending through a slot of a planar member contained between the circuit boards and mated with another of the plug and socket.

4. An enclosure as defined in claim 3 including protective caps fixed to said pillars and enclosing a top face of an upper circuit board and a bottom face of a lower circuit board.

5. An electronic circuit board enclosure comprising a planar member having dimensions at least equal to dimensions of the circuit board, first pillars fixed to at least one side of the planar member and extending orthogonally to the planar member above the planar member, means for aligning and fixing bottoms of second pillars of another circuit board enclosure to tops of said first pillars, means for fastening a first circuit board to and above the planar member, and locating means for precisely locating the fastening position of the circuit board to the planar member relative to said first pillars, whereby the position of the first circuit board can be located precisely relative to another circuit board fastened to said another circuit board enclosure, the first pillars containing pillar holes and pillar pins at opposite ends thereof, the pillar holes being sized to receive corresponding pillar pins of another circuit board enclosure with a snug fit.

6. An enclosure as defined in claim 5 in which the pillar pins are comprised of keys for being received in key slots in pillar holes of said another circuit board enclosure.

7. An enclosure as defined in claim 5 in which at least one first pillar pin is shaped to include a key for fitting into a key slot of a pillar hole in another pillar of said another circuit board enclosure.

8. An enclosure as defined in claim 5 in which the planar member is generally symmetrically rectangular, and in which the first pillars are located at four corners of the planar member.

9. An enclosure as defined in claim 5 in which the first and second pillars are comprised of mutual latch means for retaining the first and second pillars together once the latch means are mutually engaged.

10. An enclosure as defined in claim 9 in which the latch means is comprised of a resilient hook extending from one of a first and second pillar into the position of a corresponding slot of another of the first and second pillar.

11. An enclosure as defined in claim 10 in which the planar member is generally symmetrically rectangular, and in which the first pillars are located at four corners of the planar member, each of three first pillars including one of said latch means.

12. An electronic circuit board enclosure comprising a planar member having dimensions at least equal to dimensions of the circuit board, first pillars fixed to at least one side of the planar member and extending orthogonally to the planar member above the planar member, means for aligning and fixing bottoms of second pillars of another circuit board enclosure to tops of said first pillars, means for fastening a first circuit board to and above the planar member, and locating means for precisely locating the fastening position of the circuit board to the planar member relative to said first pillars, whereby the position of the first circuit board can be located precisely relative to another circuit board fastened to said another circuit board enclosure, the planar member being generally rectangular in shape, the first pillars being fixed to each of four corners of the planar member, and a frame surrounding and fixed to at least three edges of the planar member, and fixed to each of the first pillars and having height sufficient to block access to a circuit board fastened to the planar member.

13. An enclosure as defined in claim 12, in which the frame surrounds three edges of the planar member, and a removable gate located adjacent a fourth edge of the planar member, having a height sufficient to block access to a circuit board fastened to the planar member.

14. An enclosure as defined in claim 13 in which faces of the first pillars facing each other along said fourth edge contain slots each extending from an upper surface of the first pillar to a position close to a lower surface of the same first pillar for allowing opposite edges of a stiff thin rectangular gate to be slid into the slots and be retained therebetween.

15. An enclosure as defined in claim 12, including bottoms of pillars of said another circuit board enclosure fixed to tops of said first pillars, circuit boards fastened to planar members of each circuit board enclosure and precisely aligned thereto by respective locating means, the planar members containing aligned slots, a plug retained by one of the circuit boards being located opposite to and within the boundaries of the slots, a socket retained by another of the circuit boards being located opposite to and within the boundaries of the slots, at least one of the plug and socket extending through a slot of a planar member contained between the circuit boards and mated with another of the plug and socket in which the frame surrounds three edges of each planar member, and a side socket is fixed to the circuit board adjacent a fourth edge of a planar member whereby a plug can be inserted into the side socket, giving electrical access to the circuit board from outside the enclosure.

16. An enclosure as defined in claim 15 in which faces of the first pillars facing each other along said fourth edge contain slots each extend from an upper surface of the first pillar to a position close to a lower surface of the same first pillar for allowing opposite edges of a stiff thin rectangular gate to be slid into the slots and be retained therebetween, thus enclosing the circuit board in the event a plug is not inserted into a side socket of a circuit board.

17. An enclosure as defined in claim 12 in which each arm of the frame has a generally U-shaped crossection, each leg of the U-shape containing holes such as slots for conduction of air, and outer leg of the U-shape containing no holes.

18. An enclosure as defined in claim 17 in which the plane of each inner leg is approximately orthogonal to the plane of the planar member and has a height sufficient to abut an edge of an inner leg of a frame of another circuit board enclosure so as to create a fence against intrusions within the boundaries of the frame, the outer leg of the U-shape being angled outwardly from the top of the inner leg of the U-shape, whereby bottom edges of an outer leg of a frame is spaced from a top edge of an outer leg of a frame of an adjacent enclosure section, thereby allowing said air to pass therethrough.

19. An enclosure as defined in claim 13 in which the locating means is comprised of at least a pair of spaced pins extending orthogonally to the planar member in the same direction as the pillars, which pins have length sufficient to extend through a hole in the first circuit board.

20. An enclosure as defined in claim 19 in which the first pillars contain pillar holes and pillar pins at opposite ends thereof, the pillar holes being sized to receive corresponding pillar pins of another circuit board enclosure with a snug fit.

21. An enclosure as defined in claim 20 in which each arm of the frame has a generally U-shaped crossection, each leg of the U-shape containing holes such as slots for conduction of air, and outer leg of the U-shape containing no holes.

22. An electronic circuit board enclosure assembly comprising plural frame means including means for retaining the frame means together in a parallel abutting relationship, a coplanar wall of each of the frame means having a generally U-shaped crossection, the plane of each inner leg of each U-shape being approximately orthogonal to the plane of a corresponding frame means and having a height sufficient that an upper edge therefor abuts a lower edge of an adjacent inner leg of an adjacent frame means, the outer leg of each U-shape being angled outwardly from a top of a corresponding inner leg, whereby a bottom edge of an outer leg of a frame means is spaced from a top edge of an outer leg of an adjacent frame means, and the inner leg of the frame means being perforated so as to allow air to pass therethrough and into ambient air via spacing between the bottom edge of the outer leg and a top edge of an outer leg of an adjacent frame structure.

23. An electronic circuit board enclosure comprising plural circuit boards each fixed to a planar member, nesting pillars fixed to corresponding parts of the planar members, each of the planar member containing a cut-out, connectors fixed to the circuit boards and located within the bounds of the cut-out, the pillars being nested together so as to retain the circuit boards in parallel configuration with the connectors aligned and connected together.

24. An enclosure as defined in claim 23 further including alignment means for precisely locating the position of each circuit board relative to its pillars.

25. An enclosure as defined in claim 23 in which the connectors form an expandable backplane to circuitry carried by the circuit boards.

26. An enclosure as defined in claim 25 further including a frame connecting the pillars of each of the circuit boards around at least three sides of each planar member whereby sides of the circuit boards are enclosed between adjoining frames, thereby forming an expanding cabinet as the backplane is expanded.

* * * * *